(12) United States Patent
Haynie

(10) Patent No.: US 11,257,948 B2
(45) Date of Patent: Feb. 22, 2022

(54) INTEGRATED SCHOTTKY DIODE WITH GUARD RING

(71) Applicant: Texas Instruments Incorporated, Dallas, TX (US)

(72) Inventor: Sheldon Douglas Haynie, Morgan Hill, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/563,366

(22) Filed: Sep. 6, 2019

(65) Prior Publication Data

US 2021/0074839 A1 Mar. 11, 2021

(51) Int. Cl.
| | |
|---|---|
| *H01L 29/78* | (2006.01) |
| *H01L 29/06* | (2006.01) |
| *H01L 29/10* | (2006.01) |
| *H01L 29/40* | (2006.01) |
| *H01L 29/66* | (2006.01) |
| *H01L 21/74* | (2006.01) |
| *H01L 21/762* | (2006.01) |
| *H01L 21/765* | (2006.01) |

(52) U.S. Cl.
CPC ............ *H01L 29/782* (2013.01); *H01L 21/74* (2013.01); *H01L 21/765* (2013.01); *H01L 21/76202* (2013.01); *H01L 29/0649* (2013.01); *H01L 29/1083* (2013.01); *H01L 29/1095* (2013.01); *H01L 29/402* (2013.01); *H01L 29/66492* (2013.01); *H01L 29/66681* (2013.01); *H01L 29/7835* (2013.01)

(58) Field of Classification Search
CPC combination set(s) only.
See application file for complete search history.

(56) References Cited

U.S. PATENT DOCUMENTS

2017/0323970 A1* 11/2017 Dolny ............... H01L 29/66689
2019/0103498 A1* 4/2019 Pang ...................... H01L 29/36

* cited by examiner

*Primary Examiner* — Robert K Carpenter
(74) *Attorney, Agent, or Firm* — Andrew R. Ralston; Charles A. Brill; Frank D. Cimino

(57) ABSTRACT

Described examples include an integrated circuit having a semiconductor substrate having an epitaxial layer located thereon, the epitaxial layer having a surface. The integrated circuit also has a buried layer formed in the semiconductor substrate, the epitaxial layer located between the buried layer and the surface. The integrated circuit also has a Schottky contact and an ohmic contact formed on the surface. The integrated circuit also has a Pdrift region in the epitaxial layer located between the ohmic contact and the Schottky contact.

16 Claims, 12 Drawing Sheets

INTEGRATED SCHOTTKY DIODE WITH GUARD RING

TECHNICAL FIELD

This relates generally to semiconductor devices, and more specifically, but not exclusively, to Schottky diodes.

BACKGROUND

A Schottky barrier is the junction between a conductor, usually a metal, and a lightly doped semiconductor. This barrier may function as a diode. The anode of a Schottky diode includes the metal and the cathode of the Schottky diode includes the semiconductor. Schottky diodes provide higher performance in certain circuits than p-type/n-type diodes in that Schottky diodes have a smaller forward bias voltage drop than p-n junction diodes. In rectifiers, this means that Schottky-based rectifiers may consume less power (e.g., product of voltage drop and current through the Schottky diode is lower). In other circuits, Schottky diodes may prevent saturation of transistors, and thus decrease the shut-off time of those transistors. However, incorporating Schottky diodes into an integrated circuit manufacturing process flow often requires additional masking steps and sometimes additional metal deposition steps, thus increasing cost. In addition, it is difficult to manufacture Schottky diodes capable of operation with high voltages into integrated circuits with complementary metal-oxide semiconductor (CMOS) devices.

SUMMARY

In accordance with an example, an integrated circuit includes a semiconductor substrate having an epitaxial layer located thereon, the epitaxial layer having a surface. The integrated circuit also has a buried layer formed in the semiconductor substrate, the epitaxial layer located between the buried layer and the surface. The integrated circuit also has a Schottky contact and an ohmic contact formed on the surface. The integrated circuit also has a Pdrift region in the epitaxial layer located between the ohmic contact and the Schottky contact.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled." Also, in this description, the terms "on" and "over" may include layers or other elements where intervening or additional elements are between an element and the element that it is "on" or "over." The term "directly on" with respect a first layer over a second layer means the first layer touches the second layer.

Examples described hereinbelow provide a Schottky diode with high-voltage capability using a lateral diffused metal-oxide semiconductor (LDMOS) manufacturing process by modifying the position and size of elements fabricated using that LDMOS process. In an example, an integrated circuit has a semiconductor substrate having an epitaxial layer located thereon, the epitaxial layer having a surface. The integrated circuit also has a buried layer formed in the semiconductor substrate, the epitaxial layer located between the buried layer and the surface. The integrated circuit also has a Schottky contact and an ohmic contact formed on the surface. The integrated circuit also has a Pdrift region in the epitaxial layer located between the ohmic contact and the Schottky contact.

Figure 1:
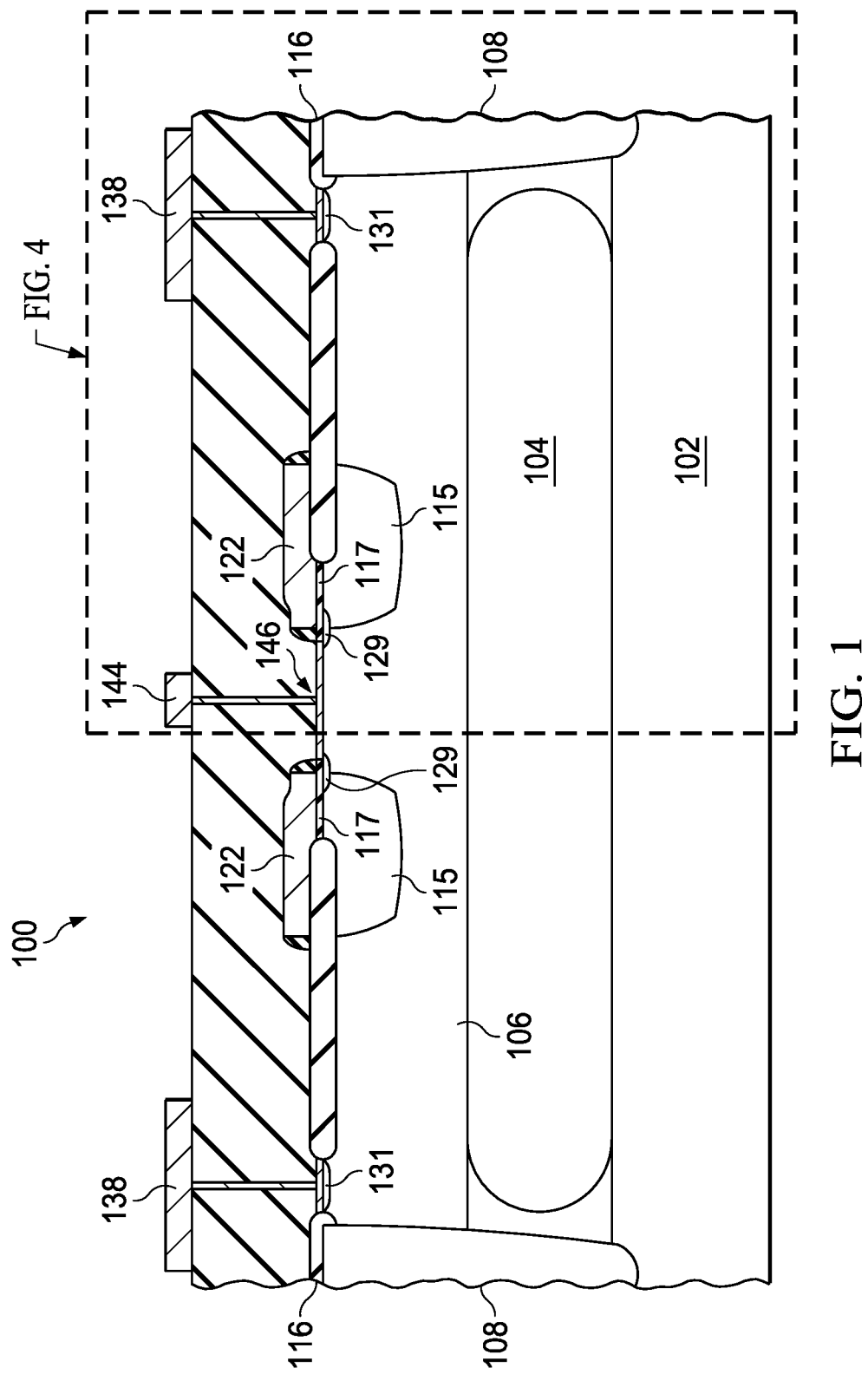
FIG. 1 is a schematic sectional representation of an example Schottky diode.

FIG. 1 is a schematic representation of an example Schottky diode 100. Heavily doped N-type buried layer 104 is over p-type substrate 102. Epitaxial layer 106 is over buried layer 104. In this example, epitaxial layer 106 is lightly doped and has n-conductivity type, and buried layer 104 is heavily doped and has an n-type conductivity. Isolation region 108 protects Schottky diode 100 from unwanted interactions with other elements formed in epitaxial layer 106 elsewhere in the wafer. In this example, isolation region 108 is a doped region of opposite conductivity type to epitaxial layer 106, e.g. p-type. Other examples may use other types of isolation, such as deep trench isolation or shallow trench isolation. Cathode contacts 138 are conductive contacts that connect to cathode contact regions 131. Cathode contact regions 131 are heavily doped n-type regions. Cathode contact regions 131 provide an ohmic contact to n-type epitaxial layer 106. Anode contact 144 contacts epitaxial layer 106 via an unreferenced metal silicide layer. Because the silicide of anode contact 144 contacts lightly doped n-type epitaxial layer 106, a Schottky barrier 146 forms between the silicide of anode contact 144 and n-epitaxial layer 106. In this example, anode contact 144 is titanium-tungsten (TiW). In other examples, anode contact comprises aluminum, titanium or other conductive materials that form a Schottky barrier to lightly doped n-type epitaxial layer 106. In another example, a silicide of tungsten, titanium, cobalt, nickel or other metal is formed at Schottky barrier 146 and the Schottky barrier is between the silicide and epitaxial layer 106.

Pdrift regions 115 are formed from one or more implants producing at least one lightly doped region having a conductivity type opposite to the conductivity type of epitaxial layer 106, e.g. p-type regions, thus providing additional p-n junction surface area. The p-n junction may distribute the electric field applied between anode contact 144 and cathode contacts 138 when Schottky diode 100 is reverse biased. Gate layer 122 is formed on a dielectric isolation layer such as first insulating layer 116 and a second insulating layer 117, e.g. a gate dielectric layer. Gate layer 122 may partially overlap a heavily doped p-type region like p+ region 129. In an example, gate layer 122 is a polysilicon plate and the polysilicon plate ends above first insulating layer 116. The p+ regions 129 may each be located partially within corresponding Pdrift regions 115 and partially within the epitaxial layer 106 (e.g. at the interface between the Pdrift regions 115 and the epitaxial layer 106), such that a p-n junction is formed between each p+ region 129 and the epitaxial layer 106 on a side of the p+ region 129 opposite the surface of the epitaxial layer 106. Thus, each p+ region 129 is located between a corresponding one of the gate layers 122 and the Schottky barrier 146, and between a corresponding one of the Pdrift regions 115 and the Schottky barrier 146. In an example, gate layer 122 is coupled to a reference potential such as ground (via an unseen connection), forming a field plate proximate to the Pdrift region 115. The gate layer 122 may thereby affect more of the electric field between anode contact 144 and cathode contact 138 in conjunction with the p-n junction between Pdrift regions 115 and n-epitaxial layer 106, and thus away from the Schottky barrier 146. This arrangement may reduce leakage at the perimeter that might otherwise occur due to high electric field. More specifically, the gate layers 122, p+ regions 129 and Pdrift regions 115 may cooperate to produce a depletion region between the Pdrift regions 115 extending into the epitaxial layer 106. The depletion region may have the effect of reducing the electrical field strength near the Schottky barrier 146, which could otherwise cause unacceptable leakage at the Schottky barrier 146. The epitaxial layer 106 outside the depletion region and between the cathode contact regions 131 and Schottky barrier 146 may function as an n-type drift region for carriers (electrons) during operation of Schottky diode 100.

Figure 2:
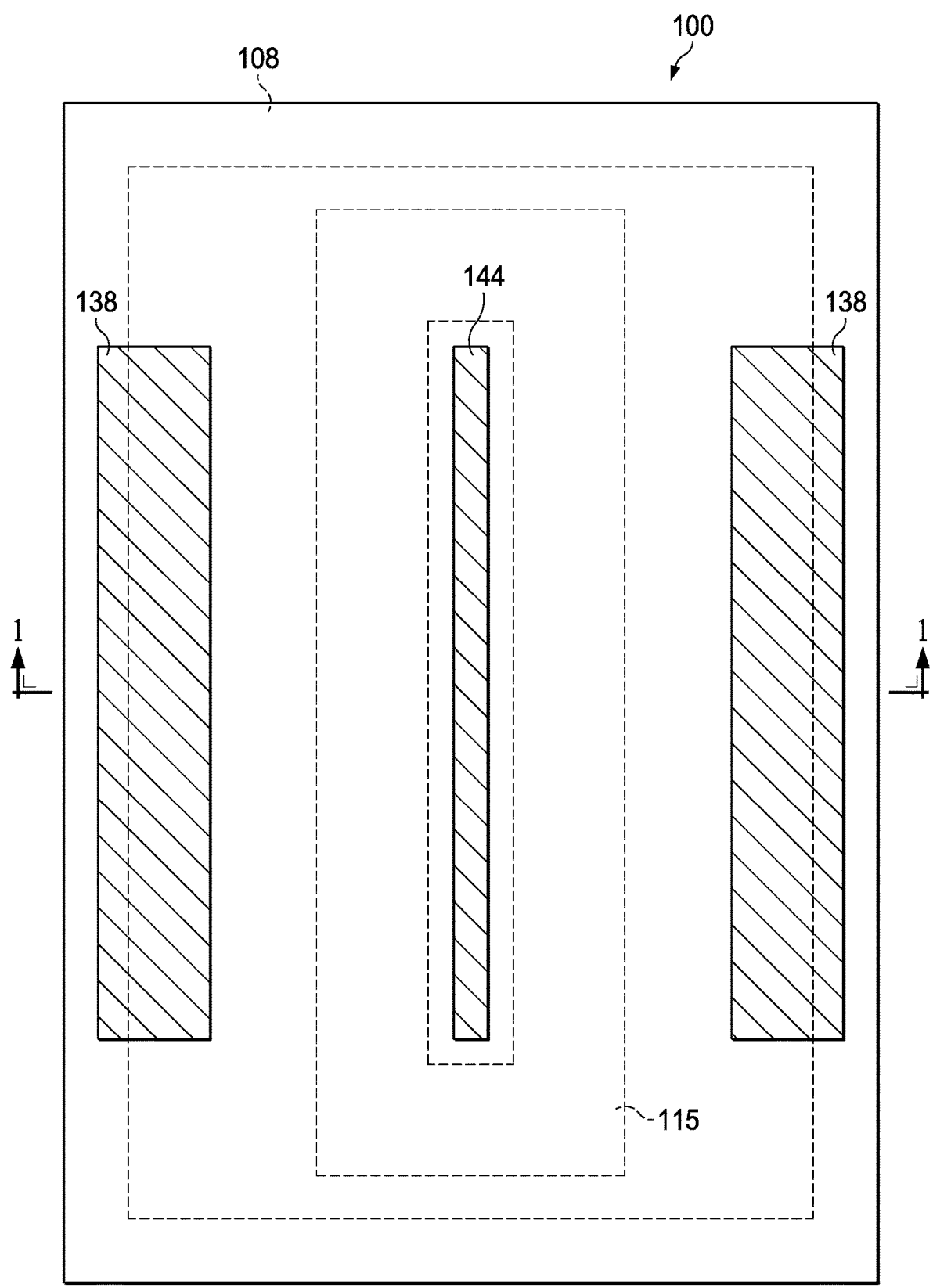
FIG. 2 is a plan view of an example Schottky diode, e.g. the Schottky diode of FIG. 1.

FIG. 2 is a layout diagram (top view) of an example Schottky diode, e.g. the Schottky diode 100 of FIG. 1. Cut lines indicate the plane of view of FIG. 1. The view of FIG. 2 shows anode contact 144, cathode contacts 138, Pdrift region 115, and isolation region 108. Isolation region 108 surrounds the internal geometry of Schottky diode 100. The cathode contacts 138 and anode contact 144 are shown as linear rectangular features, with the Pdrift region 115 forming an annular ring around the anode contact 144. The layout of FIG. 2 is but one of many possible layouts that may conform to the relationships of features shown in the sectional view of FIG. 1.

Figure 3:
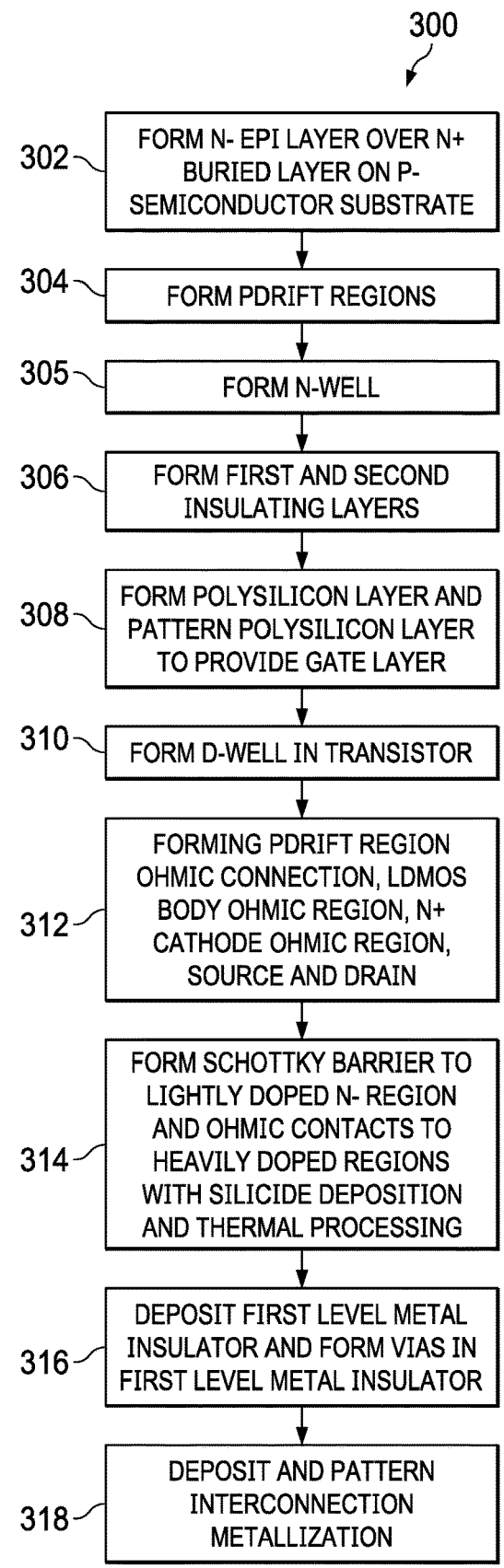
FIG. 3 is a flow diagram of an example process.
Figure 4A:
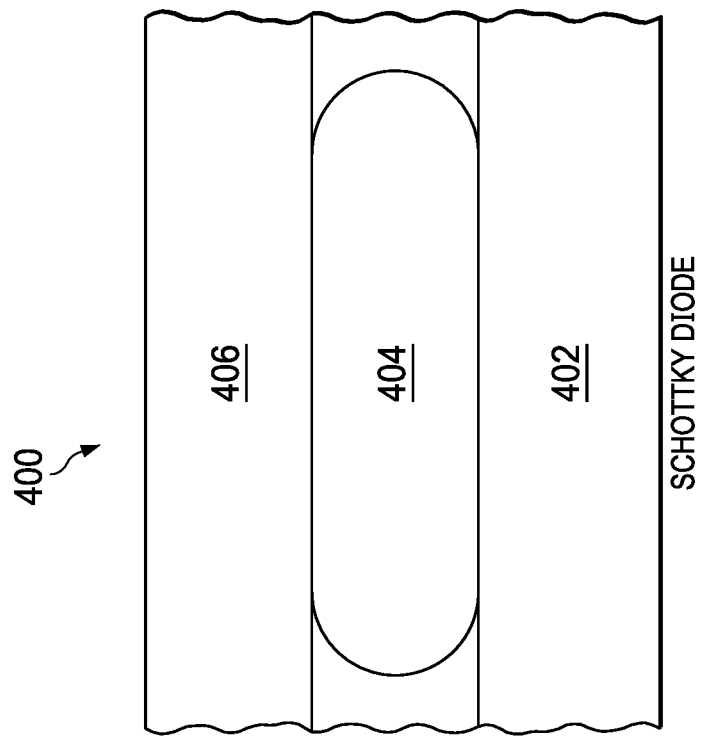
FIGS. 4A-4I (collectively "FIG. 4") illustrate the steps of the process of FIG. 3.
Figure 4A:
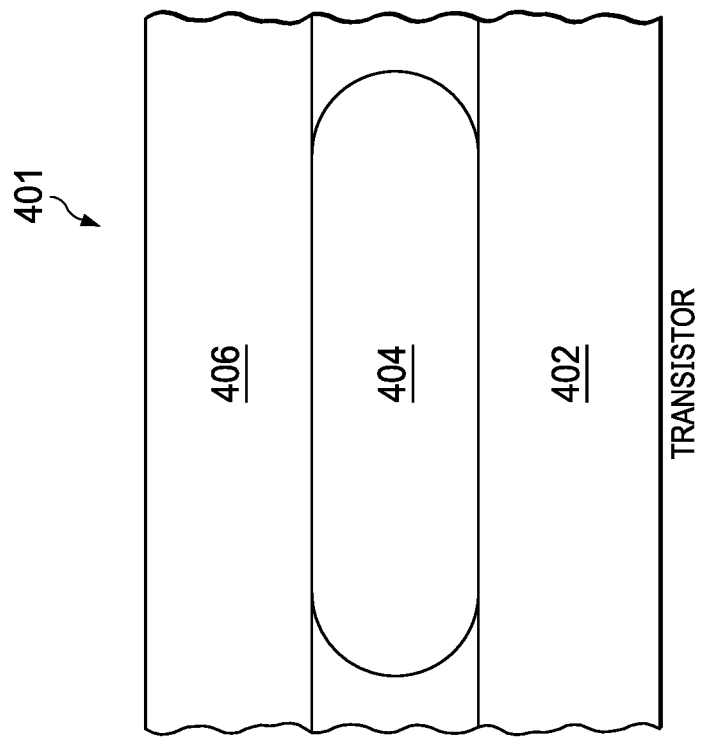

FIG. 3 is a flow diagram of an example process 300, e.g. for forming a Schottky diode concurrently with forming an LDMOS transistor. FIGS. 4A-4I (collectively "FIG. 4") illustrate the steps of process 300 and are described concurrently with the description of FIG. 3. In each of FIGS. 4A-4I, a leftmost figure depicts a portion of a Schottky diode 400 that corresponds to the outlined portion of FIG. 1, while a rightmost figure depicts a representative LDMOS transistor 401 that may be formed concurrently on a same substrate. In this example, the substrate is crystalline silicon, but can be other types of materials, e.g. Ge or GaAs. Isolation regions (not shown) surrounding Schottky diode 400 and transistor 401 are omitted for clarity of the drawing. Step 302 includes forming a lightly doped n-type epitaxial layer 406, over a n+ buried layer on a p-semiconductor substrate 402 using epitaxial deposition as shown in FIG. 4A. Epitaxial layer 406 serves as the subsequent substrate for forming Schottky diode 400 and transistor 401. Also, in this example, the epitaxial layer 406 is n-type and the buried layer 404 is n-type.

Figure 4B:
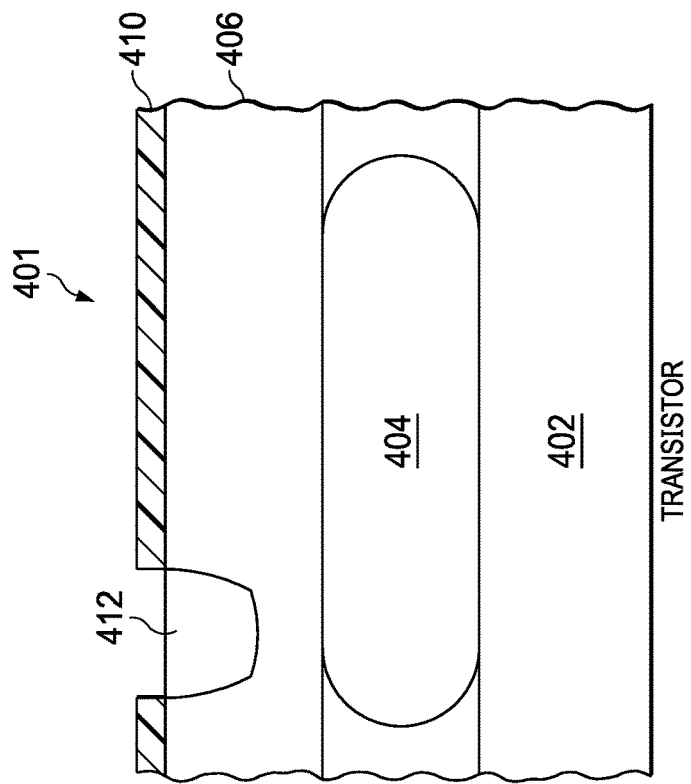
Figure 4B:
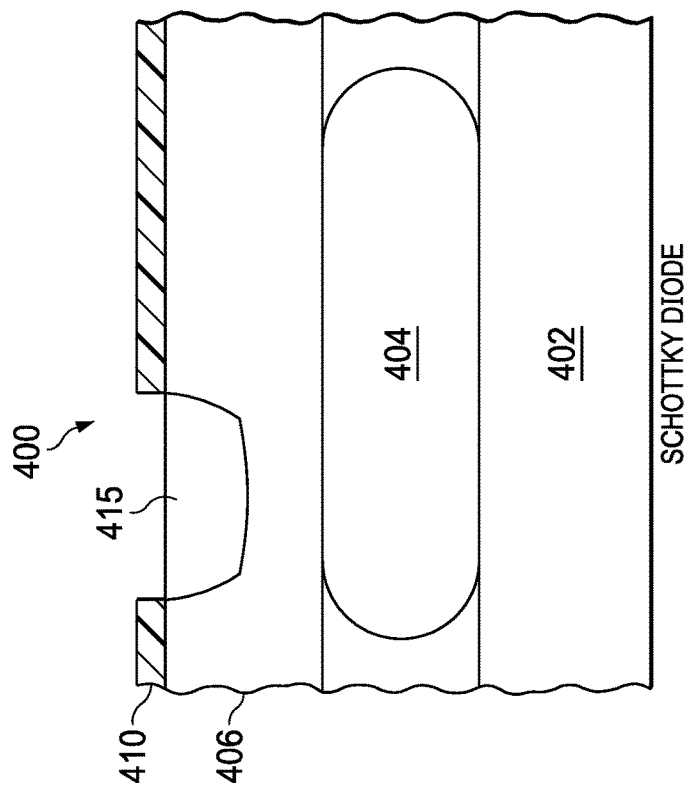

Step 304 includes forming Pdrift region 412 under a gate region (e.g. the channel region) in transistor 401 and forming a Pdrift region 415 in Schottky diode 400 as shown in FIG. 4B. In this example, a sequential "chain" ion implantation of boron atoms at a density of $1 \times 10^{11}$ to $3 \times 10^{12}$ atoms/cm$^2$ with energies of 30-1600 keV using first mask 410 forms p-doped, e.g. boron doped, Pdrift regions 412 and 415.

Figure 4C:
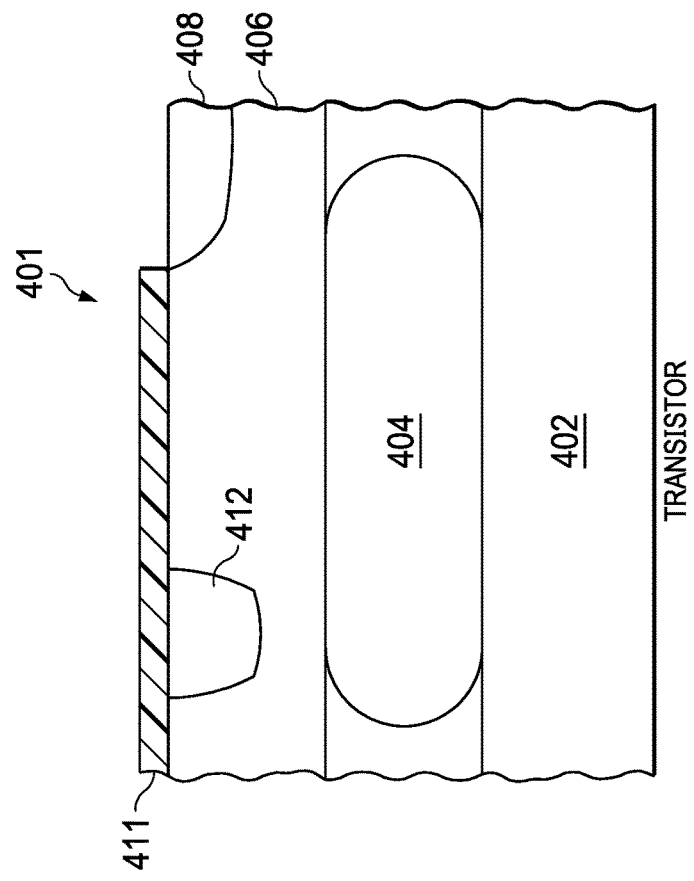
Figure 4C:
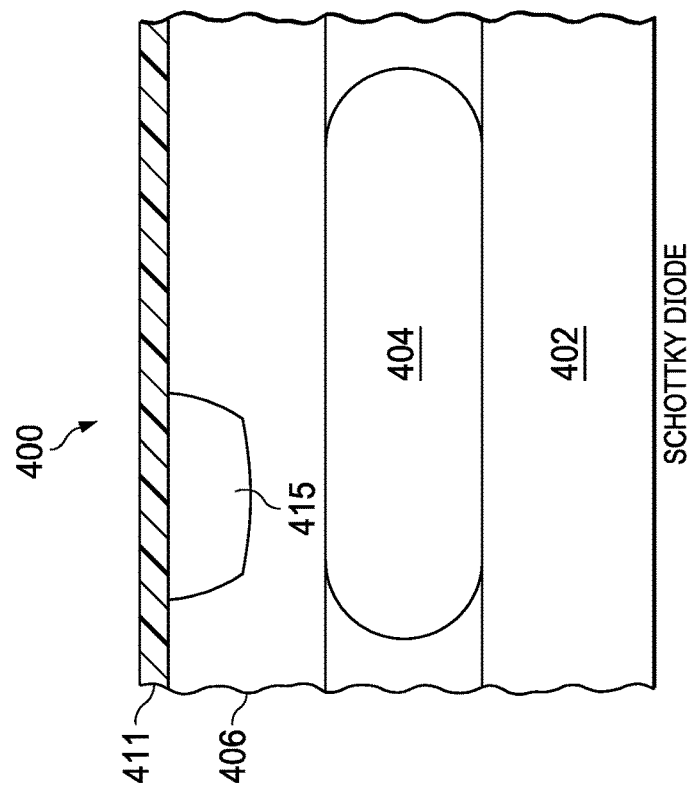

Step 305 includes forming n-well 408 in transistor 401, but not in the Schottky diode 400, as shown in FIG. 4C. Ion implantation of phosphorus atoms at a density of $1 \times 10^{13}$ to $3 \times 10^{14}$ atoms/cm$^2$ with an energy of 50-500 keV using second mask 411 forms N-well 408.

Figure 4D:
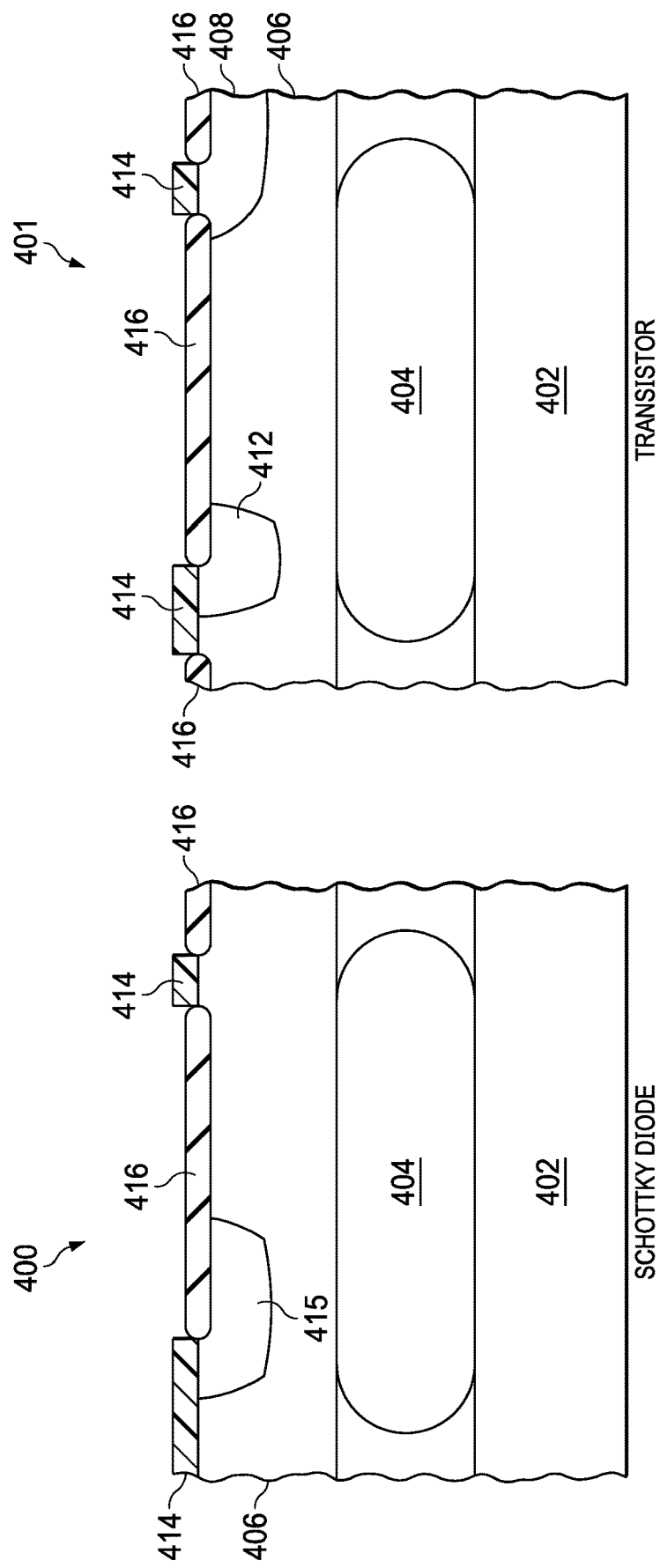

Step 306 includes forming a first insulating layer 416 as shown in FIG. 4D. In the Schottky diode 400 the first insulation layer serves as an insulator above the drift region of the Schottky diode 400 (e.g. the portion of epitaxial layer 406 between the later-formed anode and cathode). In the transistor 401 the first insulating layer 416 serves as a gate insulator. A mask 414 defines first insulating layer 416, and a portion partially covers Pdrift regions 412 and 415. In this example, local oxidation of silicon (LOCOS) or shallow trench isolation (STI) forms first insulating layer 416. With LOCOS, an oxidizing environment such as steam oxidizes the exposed portions of epitaxial layer 406, N-well 408, Pdrift region 412, and Pdrift region 415 not covered by mask 414 to form a silicon dioxide layer to a thickness of 200 nm to 600 nm, such as first insulating layer 416. With STI, an anisotropic etch such as plasma etching using carbon tetrafluoride or similar chemistry etches the exposed portions of epitaxial layer 406, N-well 408, Pdrift region 412, and Pdrift region 415 not covered by mask 414 to form a shallow trench. Selective deposition of silicon dioxide or another suitable insulator then fills the shallow trench to a thickness of 200 nm to 600 nm to form first insulating layer 416. After forming first insulating layer 416, mask 414 is removed to expose surfaces of epitaxial layer 406, N-well 408, Pdrift region 412, and Pdrift region 415 that were covered by mask 414. These surfaces are then exposed to an oxidizing environment to form a second insulating layer, not shown, to a thickness of 20 nm to 50 nm by thermal oxidation.

Figure 4E:
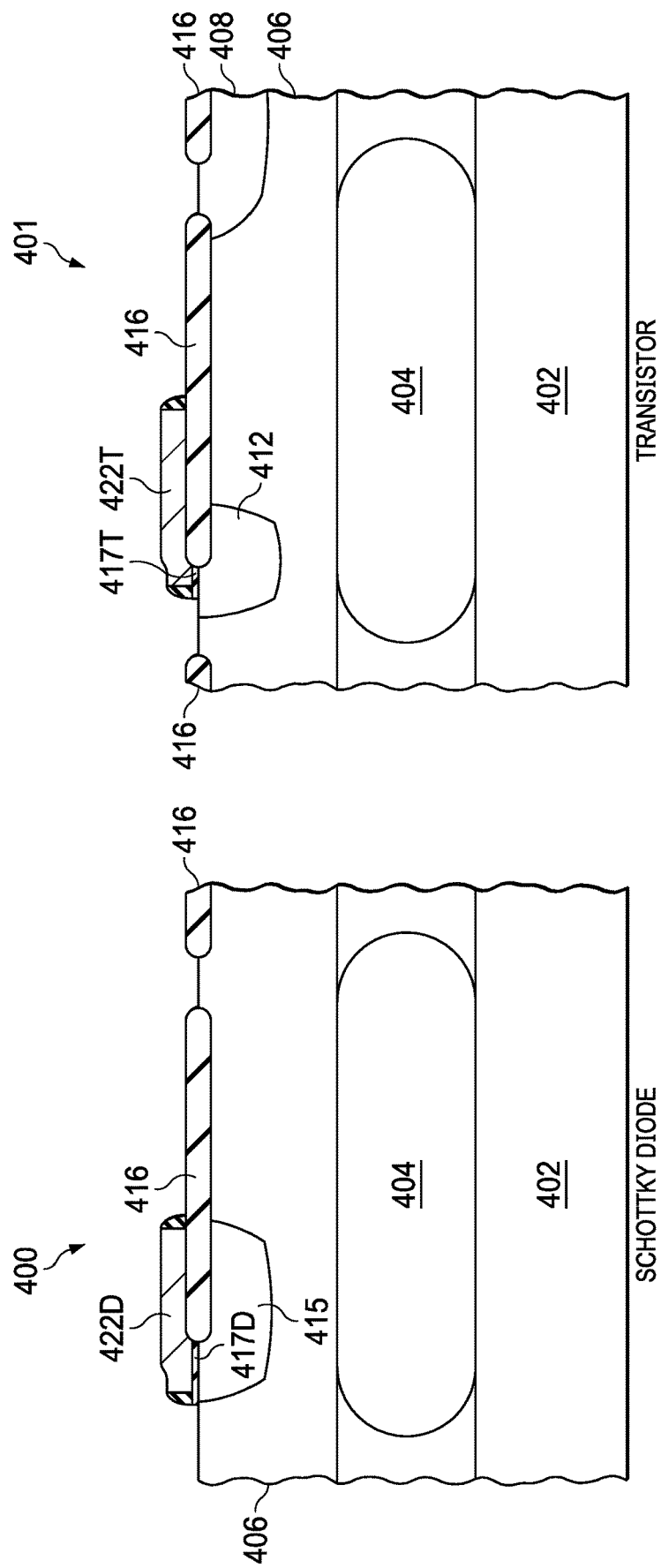

Step 308 includes forming field plate 422D and gate 422T as shown in FIG. 4E. Depositing polycrystalline silicon and etching the deposited polycrystalline silicon using a photolithographic mask forms patterned field plate 422D and the gate 422T above both first insulating layer 416 and gate oxide layers 417D and 417T formed from the second insulating layer. In this example, polycrystalline silicon forms the field plate 422D and the gate 422T. In other examples, silicon chromium (SiCr), nickel chromium (NiCr), and tantalum nitride (TaN) may form the field plate 422D and the gate 422T. Thus, in this example field plate 422D in Schottky diode 400 and gate 422T in LDMOS transistor 401 are formed of a same material layer. After forming the field plate 422D and gate 422T, a conformal dielectric layer, e.g. comprising an oxide layer, is formed over the field plate 422D and gate 422T. The conformal dielectric layer may then be etched back to remove this layer from most of the surface, leaving unreferenced sidewall spacers. The etchback also has the effect of removing the second insulating layer from portions of the surface not protected by the field plate 422D, the gate 422T, and their associated sidewall spacers, thus forming the gate oxide layers 417D and 417T.

Figure 4F:
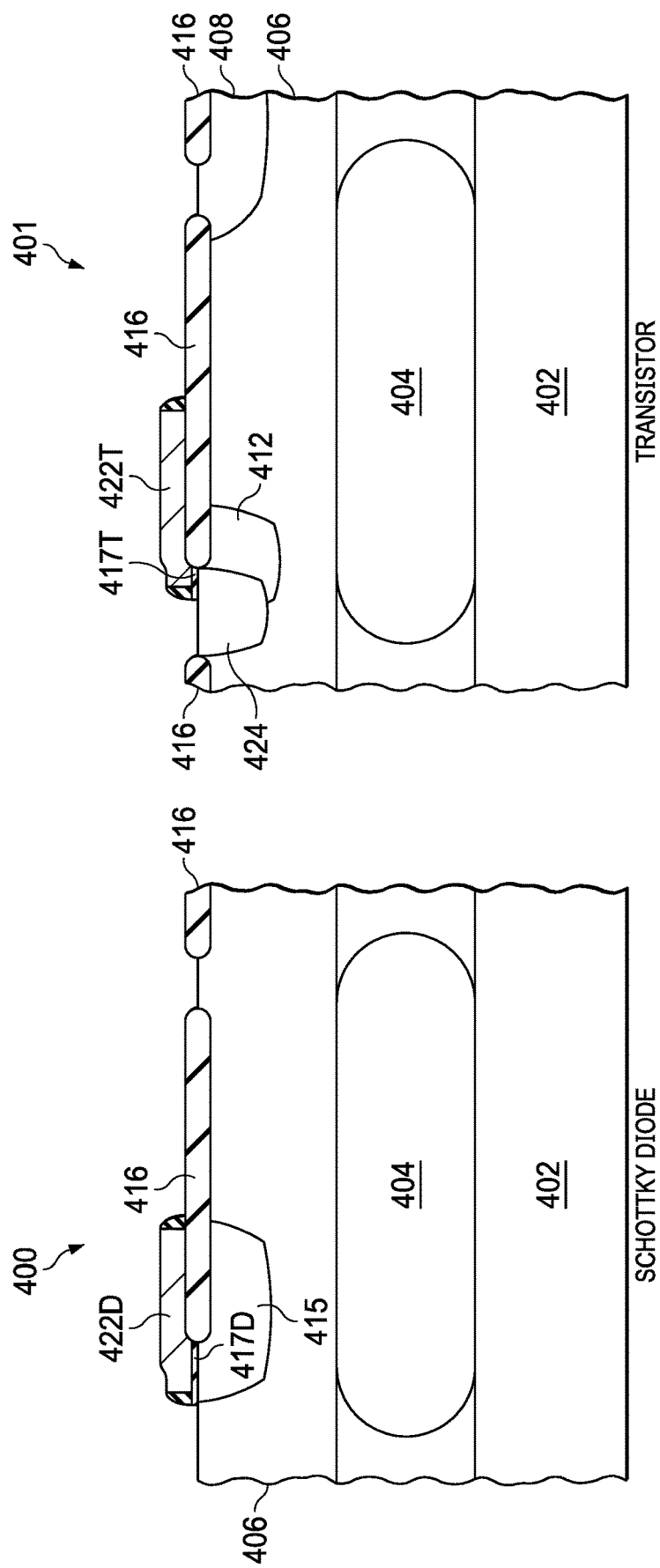

Step 310 includes forming double-diffused well (d-well) 424 in transistor 401 as shown in FIG. 4F. Schottky diode 400 is masked (not shown) and d-well 424 is not formed in Schottky diode 400. D-well 424 is a double-diffused well that includes both n-type and p-type dopant atoms. For example, implantation of dopant atoms such as boron or indium provides the p-type dopant of d-well 424. An example is implanting of boron with an energy of 20 keV at a dose of $8 \times 10^{13}$ to $3.0 \times 10^{14}$ atoms/cm$^2$. Other examples use indium (In) because it is a relatively heavy atom that has a low diffusion coefficient relative to boron, which may be advantageous in some examples. Implantation of an n-type dopant such as arsenic and or phosphorus provides the n-type dopant of d-well 424. An example is implanting arsenic with a density of $5 \times 10^{13}$ to $1.2 \times 10^{15}$ atoms/cm$^2$ at an energy 10 to 30 keV. The selection of the angles and energies of implantation for d-well 424 determines, in part, the threshold voltage of the transistor 401.

Figure 4G:
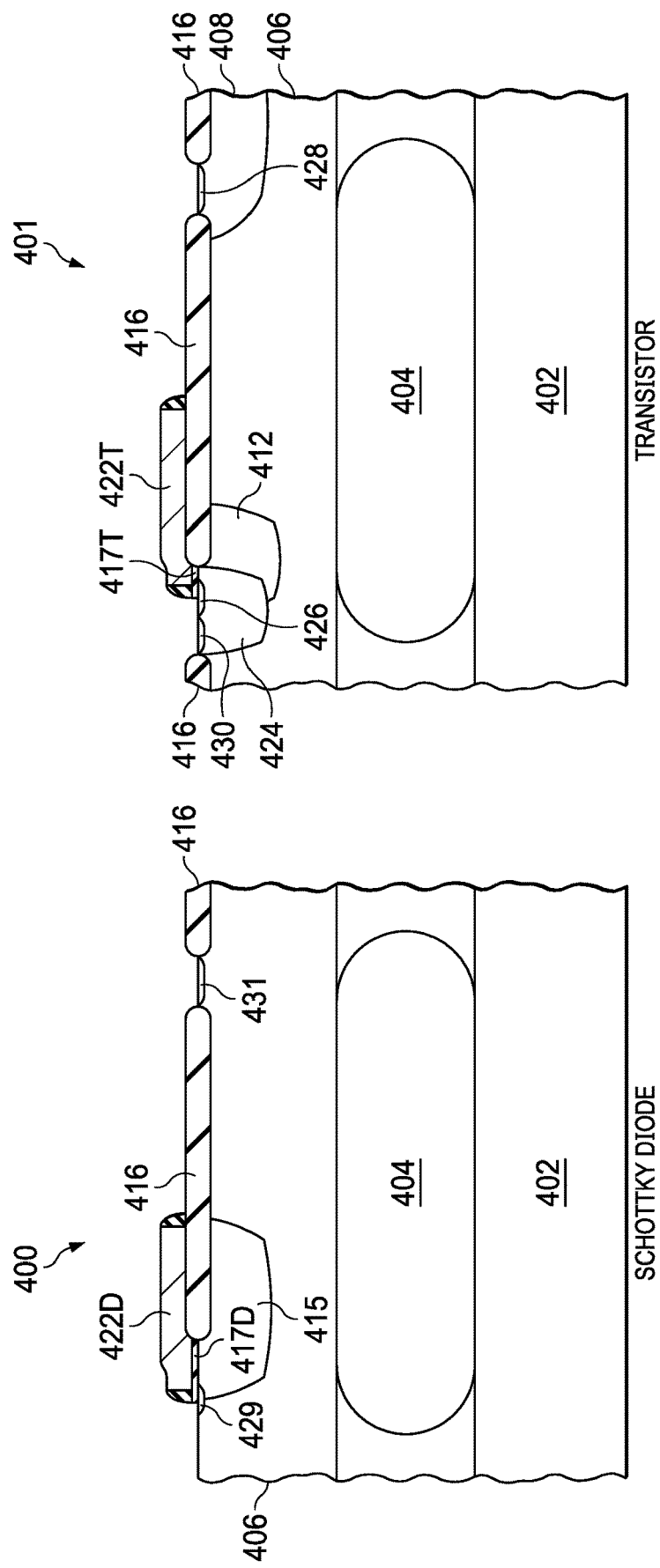

Step 312 includes forming Pdrift region ohmic p+ contact 429, and LDMOS body ohmic p+ region 430, n+ cathode ohmic region 431, n+ source 426 and drain n+ 428 as shown in FIG. 4G. Each of these doped regions intersects the surface of the epitaxial layer 406. Photolithographic masks (not shown) align n+ source 426 with gate 422T and aligns Pdrift region ohmic contact 429 to the field plate 422D and the edge of Pdrift region 415. First insulating layer 416 also serves as a mask element, defining more accurately drain 428 and cathode ohmic region 431. An example implantation for forming Pdrift region ohmic contact 429 and LDMOS body ohmic P+ region 430 is implanting boron at $5 \times 10^{15}$ atoms/cm$^2$ at an energy of 10-30 keV. N+ cathode ohmic region 431, source 426 and drain 428 are formed by implanting arsenic with a density of $5 \times 10^{15}$ atoms/cm$^2$ at an energy of 10 keV to 30 keV.

Figure 4H:
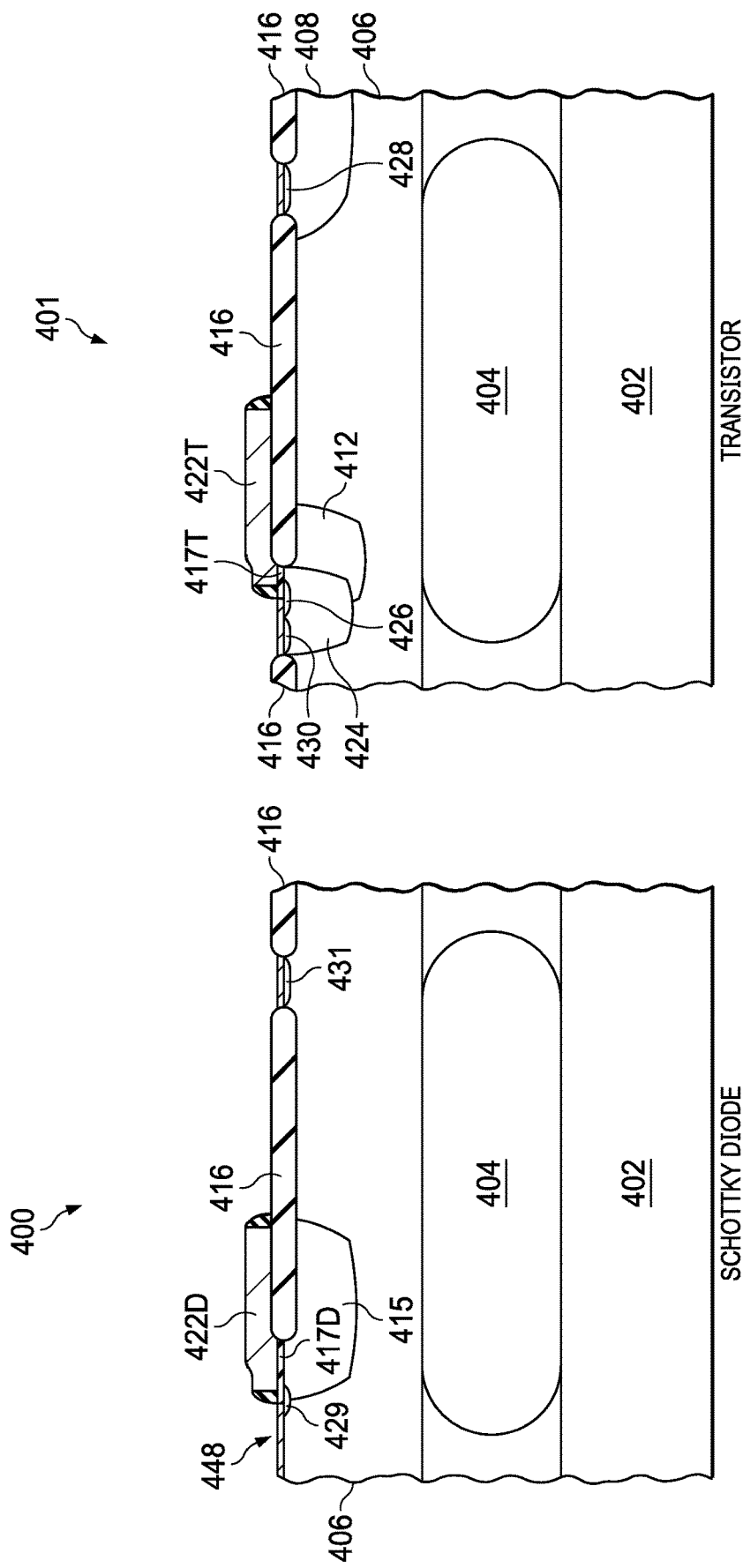

Step 314 includes forming a thin metal silicide, in this example a silicide of cobalt, titanium, nickel, or similar metals as shown in FIG. 4H. The silicide may be formed on the Pdrift region ohmic contact 429, the epitaxial layer 406 adjacent the Pdrift region ohmic contact 429, and cathode ohmic region 431. Similar silicide regions form ohmic contacts to the LDMOS body ohmic region 430, source 426 and drain 428, respectively. In addition, a silicide layer (not shown) is formed on the field plate 422D and the gate 422T. The silicide on the exposed portion of the n-epitaxial layer 406 is designated silicide 448, and creates a Schottky barrier with the epitaxial layer 406.

Figure 4I:
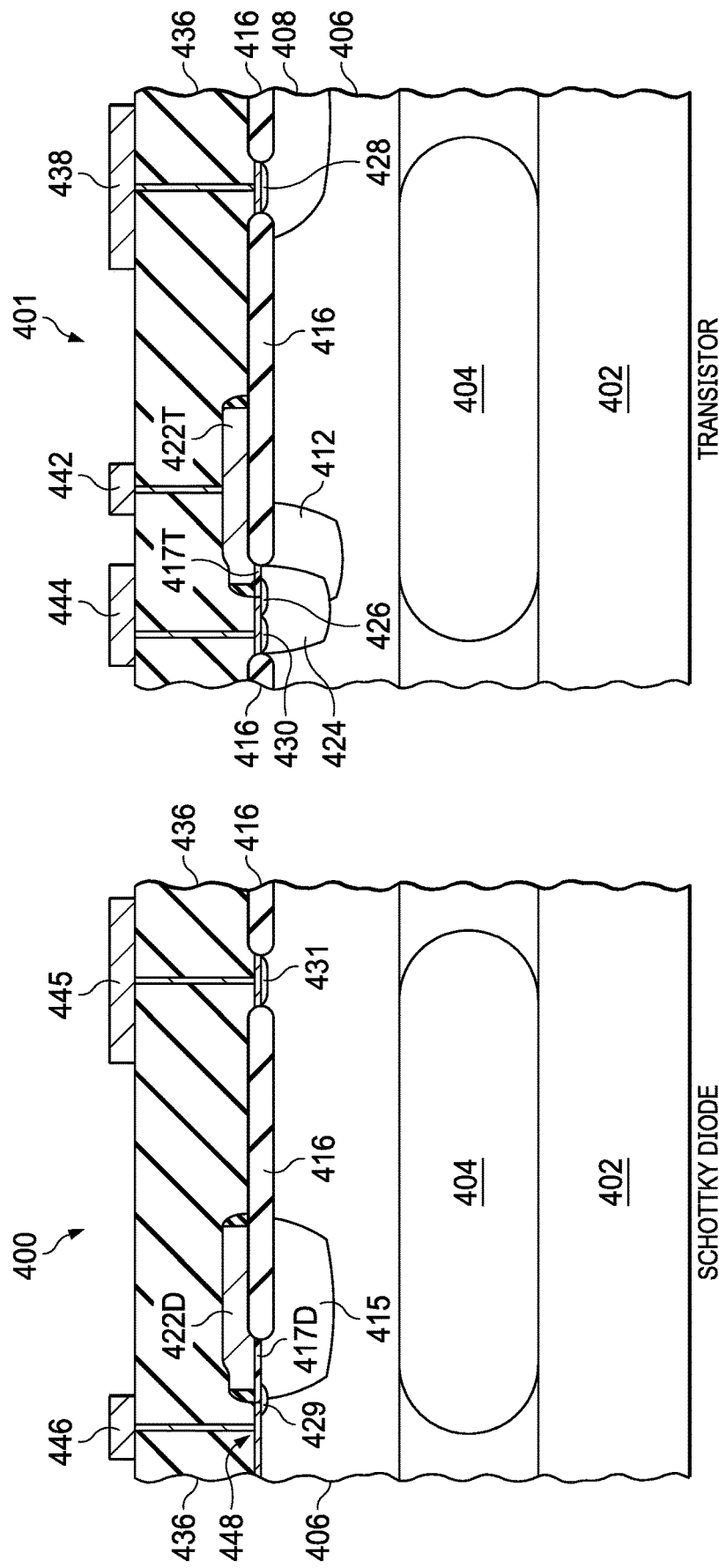

After silicide formation, step 316 includes forming a first level metal insulator 436 as shown in FIG. 4I. First level metal insulator is formed by, for example, chemical vapor deposition of silicon dioxide using tetraethyl orthosilicate (TEOS) and/or plasma enhanced CVD of silane to a thickness of 1 μm to 2 μm followed by chemical-mechanical polishing (CMP). Using a mask (not shown), etching of first level metal insulator 436 provides via openings over the silicide 448, cathode ohmic region 431, LDMOS body ohmic region 430, source 426 and drain 428, respectively. Step 318 includes forming interconnection metallization, which includes first conductive contact 438 to drain 428; forming second conductive contact 442 to gate 422T; forming third conductive contact 444 to source 426 and LDMOS body ohmic P+ region 430; forming fourth conductive contact 445 to cathode ohmic region 431; and fifth conductive contact 446, which connects the Schottky anode formed by silicide 448 in contact with epitaxial layer 406. A conductor such as tungsten (W) fills the via openings, with optional barrier metals sputtered before depositing the conductor. A planarization, such as CMP, removes any conductor from the surface of first level metal insulator 436 leaving a top surface of the tungsten vias nearly flush with the surface of first level metal insulator 436. In other examples, other conductive materials fill the via, such as aluminum, titanium, metal silicides and others. A first level metal, such as aluminum is deposited and patterned by etching using a photolithographic mask (not shown) to complete first conductive contact 438, second conductive contact 442, third conductive contact 444, and fourth conductive contact 445 and fifth conductive contact 446.

Modifications are possible in the described examples, and other examples are possible, within the scope of the claims.

What is claimed is:

1. An integrated circuit comprising:
   a semiconductor substrate having an epitaxial layer located thereon, the epitaxial layer having a surface;
   a buried layer formed in the semiconductor substrate, the epitaxial layer located between the buried layer and the surface;
   a Schottky contact and an ohmic contact formed on the surface; and
   a Pdrift region in the epitaxial layer located between the ohmic contact and the Schottky contact, the Pdrift region having a Pdrift doping level and forming an annular ring around the Schottky contact.

2. The integrated circuit of claim 1, wherein the epitaxial layer is N-doped at a first doping level (N) and the Schottky contact includes a metal silicide in contact with the epitaxial layer.

3. The integrated circuit of claim 1, further comprising a p-type region doped at a doping level greater than the Pdrift doping level and intersecting the surface between the Pdrift region and the Schottky contact.

4. The integrated circuit of claim 3, further comprising a field plate that extends over the Pdrift region and ends over the p-type region.

5. The integrated circuit of claim 1, further including a dielectric isolation layer on the surface of the semiconductor substrate between the ohmic contact and the Schottky contact.

6. The integrated circuit of claim 1, wherein the epitaxial layer and the buried layer are n-type.

7. The integrated circuit of claim 1, wherein the Pdrift region has a second conductivity type opposite to a first conductivity type of the epitaxial layer.

8. The integrated circuit of claim 1, further comprising a field plate located over the Pdrift region.

9. The integrated circuit of claim 1, further including an isolation region extending from the surface to the semiconductor substrate, the isolation region surrounding the ohmic contact and the Schottky contact.

10. The integrated circuit of claim 1, further comprising a gate layer over the Pdrift region, and a lateral diffused metal-oxide semiconductor (LDMOS) transistor formed in or over the semiconductor substrate, the LDMOS transistor including a gate formed from a same material layer as the gate layer.

11. An integrated circuit comprising:
    a semiconductor substrate;
    an n-type epitaxial layer having a first n-dopant concentration located over the semiconductor substrate and having a surface;
    an n-type buried layer formed between the semiconductor substrate and the n-type epitaxial layer and having a second n-dopant concentration greater than the first dopant concentration;
    first and second linear rectangular n-type cathode contact regions each having a third n-dopant concentration greater than the first n-dopant concentration and being spaced apart along the surface of the epitaxial layer;
    a linear rectangular metal silicide anode contact formed on the surface of the n-type epitaxial layer between the first and second cathode contact regions; and
    a first p-type region having a first p-dopant concentration and being located at the surface of the n-type epitaxial layer, the first p-type region surrounding the metal silicide anode contact.

12. The integrated circuit of claim 11, further including a dielectric isolation layer extending over the first p-type region.

13. The integrated circuit of claim 11, further comprising a second p-type region having a second p-dopant concentration greater than the first p-dopant concentration located at the surface, an interface between the first p-type region and the n-type epitaxial layer ending at the second p-type region.

14. The integrated circuit of claim 13, further comprising a polysilicon plate located over the first p-type region and ending over the second p-type region.

15. The integrated circuit of claim 14, further comprising a dielectric isolation layer located over the n-type epitaxial layer, the dielectric isolation layer extending over the first p-type region, wherein the first polysilicon plate ends over the first dielectric isolation layer.

16. The integrated circuit of claim 14, further comprising a gate dielectric layer between the polysilicon plate and the first p-type region.

* * * * *